United States Patent [19]
Gullapalli et al.

[11] Patent Number: 5,786,693
[45] Date of Patent: Jul. 28, 1998

[54] BATCH MULTI-VOLUME ANGIOGRAPHY USING MAGNETIC RESONANCE IMAGING

[75] Inventors: Rao P. Gullapalli; Mark J. Loncar. both of Richmond Heights; Paul M. Margosian. Lakewood. all of Ohio

[73] Assignee: Picker International, Inc., Highland Heights. Ohio

[21] Appl. No.: 638,641

[22] Filed: Apr. 26, 1996

[51] Int. Cl.$^6$ ..................................... G01V 3/00
[52] U.S. Cl. .............................. 324/309; 324/306
[58] Field of Search .................... 324/309, 307, 324/312, 314, 306, 300

[56] References Cited

U.S. PATENT DOCUMENTS

| | | | |
|---|---|---|---|
| 4,516,582 | 5/1985 | Redington | 128/653 |
| 4,609,872 | 9/1986 | O'Donnell | 324/306 |
| 4,803,431 | 2/1989 | Sano et al. | 324/306 |
| 5,022,397 | 6/1991 | Dumoulin | 128/653 AF |
| 5,167,232 | 12/1992 | Parker et al. | 128/653.3 |
| 5,307,014 | 4/1994 | Laub | 324/306 |
| 5,327,088 | 7/1994 | Pipe | 324/309 |
| 5,528,144 | 6/1996 | Gullapalli et al. | 324/309 |
| 5,541,511 | 7/1996 | Hennig | 324/309 |

*Primary Examiner*—Louis M. Arana
*Attorney, Agent, or Firm*—Fay. Sharpe. Beall, Fagan, Minnich & McKee

[57] ABSTRACT

A sequence controller (40) controls the pulses applied by the radio transmitter (24) and the gradient amplifiers (20) and gradient coils (22) such that each repetition includes a prepreparation sequence segment. such as a presaturation sequence segment and a magnetization transfer contrast correction (MTC) segment, and a plurality of image sequence segments. More specifically, each of the image sequence segments induce resonance. phase and frequency-encode the resonance, and generate one or more views of data, all within a corresponding one of a plurality of slabs or sub-regions ($74_1$, $74_2$, ...) of an image volume (72). More precisely to the preferred embodiment, the imaging sequence segments interleave the slabs such that resonance is not excited concurrently in adjacent slabs, without exciting resonance and collecting a view in a non-adjacent slab. The views are sorted (80) by slab and stored in corresponding slab data memories (82). The data in each slab memory is reconstructed (84) into a corresponding slab image stored in corresponding slab image memories (86). The slab images are stacked or combined (88) into a volumetric image representation of the region of interest and stored in a volume image memory (90).

16 Claims, 2 Drawing Sheets

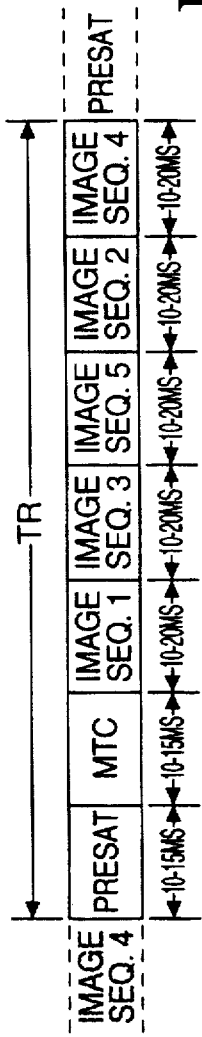
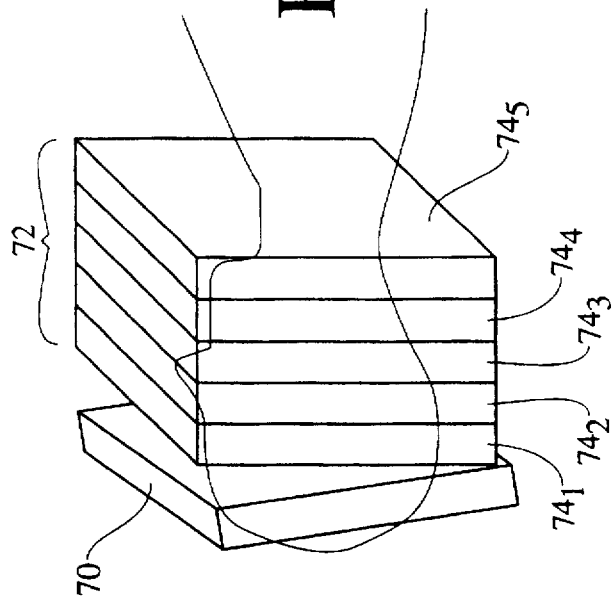

BATCH MULTI-VOLUME ANGIOGRAPHY USING MAGNETIC RESONANCE IMAGING

BACKGROUND OF THE INVENTION

The present application relates to the magnetic resonance arts. It finds particular application in conjunction with multi-slab volume imaging and will be described with particular reference thereto.

Various techniques have been developed for generating image data for a volume of a patient. In one technique, a series of contiguous slice images are generated. That is, magnetic resonance is phase-encoded along one axis of a single pixel thick slice and phase-encoded along an orthogonal axis. The phase and frequency-encoded magnetic resonance data is reconstructed into a slice image. This process is then repeated for a plurality of contiguous slices to generate volume image data.

Rather than imaging slice by slice, three-dimensional volume techniques have also been developed. In one three-dimensional volume technique, magnetic resonance is excited in an entire volume of interest. The resonance is frequency-encoded along one axis, phase-encoded along a first orthogonal axis, and further phase-encoded along a second mutually orthogonal axis. This frequency and two-dimensionally phase-encoded data is then reconstructed into a volumetric image representation.

In another volume imaging technique, magnetic resonance is excited in sub-volumes or slabs of the overall region of interest. More specifically, magnetic resonance is excited in a slab, which magnetic resonance is frequency and two-dimensionally phase-encoded as described above but only within the slab. After the slab sub-volume has been reconstructed, magnetic resonance is excited in another slab, parallel to the first slab, and the process repeated. The image data from a plurality of slabs is combined together to make the volume image data. As illustrated in U.S. Pat. No. 5,167,232 of Parker, et al., the data can be generated from two sets of slabs that are offset by half a slab. Redundant slice data from two overlapping slabs is weighted or averaged to smooth inter-slab discontinuities. Of course, collecting redundant data for averaging increases the sequence duration. Increasing the sequence duration tends to increase related artifacts, particularly artifacts due to patient motion.

One common application for volume imaging is magnetic resonance angiography. In angiography applications, the time to image the entire volume is a serious consideration. Typically, each sequence repetition includes a presaturation portion of about 10–15 msec. The presaturation is used to block venous flow into the slab such that only arterial flow is imaged. The presaturation portion is typically followed by a magnetization transfer contrast sequence portion to suppress background signal from macromolecules. Finally, a motion compensated imaging sequence portion of about 10–20 msec. is applied. Typical motion compensated imaging sequences include gradient-echo and spin-echo based sequences. During the motion-compensated image sequence portion, a line of data is read. Then, in each subsequent repetition, the entire presaturation, magnetization transfer contrast, and motion-compensated imaging sequence routine is repeated. Thus, a typical repeat time (TR) may be on the order of 40 msec. When data is collected in four contiguous slabs each of 30 slices with 256×256 pixel resolution, data acquisition requires about 16 minutes. When the slabs are overlapped creating redundancy, the data acquisition time increases accordingly with a substantial doubling in the data acquisition time when the slabs are fully overlapped.

The present invention provides a new and improved volume imaging sequence which overcomes the above-referenced problems and others.

SUMMARY OF THE INVENTION

In accordance with one aspect of the present invention, a magnetic resonance imaging system is provided. A magnet generates a temporally constant magnetic field through an examination region. A transmitter induces dipoles in the examination region to resonate such that radio frequency resonance signals are generated. Gradient amplifiers and gradient magnetic field coils generate at least slab select, phase, and read magnetic field gradients along orthogonal axes across the examination region. A receiver receives and demodulates the radio frequency resonance signals read during the read gradients to produce a series of data lines. An image memory stores a reconstructed volume image representation. A sequence controller controls the transmitter and the gradient amplifiers to cause, in each repetition, the application of (i) at least one prepreparation sequence segment, (ii) a first imaging sequence segment for inducing magnetic resonance in a first slab of the examination region, phase and frequency-encoding the induced resonance, and receiving at least one view from the first slab, and (iii) a second imaging sequence segment for inducing magnetic resonance in a second slab of the examination region, phase and frequency-encoding the induced resonance, and receiving at least one view from the second slab. A sorter sorts the views by slab among first and second slab data memories. A volume reconstruction processor reconstructs the data from the first slab memory into a first slab image representation and the data from the second slab memory into a second slab image representation. A combining circuit combines the first and second slab image representations to form the volume image representation stored in the image memory.

In accordance with another aspect of the present invention, a method of magnetic resonance imaging is provided in which a plurality of imaging sequence repetitions are applied to generate a plurality of views. In each of the plurality of imaging sequences and at least one prepreparation sequence segment are applied. First and second imaging sequence segments are applied to excite resonance in first and second slabs, respectively, phase and frequency-encode the excited resonance, and cause the generation of a corresponding digital data line. The digital data lines from the first slab are reconstructed into a first electronic slab image representation and the digital data lines from the second slab are reconstructed into a second electronic slab image representation. The first and second slab image representations are combined.

In accordance with a more limited aspect of the present invention, the at least one prepreparation sequence segment includes one or both of a presaturation sequence segment and a magnetization transfer contrast sequence segment.

In accordance with a more limited aspect of the present invention, each imaging sequence repetition further includes exciting resonance in each of a third and fourth slab, phase and frequency-encoding the excited resonance, and causing the generation of corresponding digital data lines. The data lines from the third slab are reconstructed into a third image representation and the data lines from the fourth slab are reconstructed into a fourth image representation. The first, second, third, and fourth slab image representations are combined.

In accordance with another more limited aspect of the present invention, a further plurality of image sequence representations are intermixed with the first plurality of image representations. Each further imaging sequence representation includes reapplying the presaturation sequence segment and the magnetization transfer contrast correction segment as well as third and fourth imaging sequence segments. The third and fourth imaging sequence segments excite magnetic resonance in third and fourth slabs, respectively, phase and frequency-encode the excited resonance, and cause the generation of corresponding digital data lines. The data lines from the third slab are reconstructed into a third electronic image representation and the data lines from the fourth slab are reconstructed into a fourth electronic slab image representation. The first, second, third, and fourth electronic slab image representations are combined to generate a volume image of the region of interest.

In accordance with another aspect of the present invention, a method of magnetic resonance imaging of a volume of interest by applying a plurality of magnetic resonance imaging sequence repetitions is provided. In each of a plurality of the magnetic resonance imaging repetitions, a first imaging sequence segment is applied to excite magnetic resonance in a first sub-region of the volume of interest, phase and frequency-encode the excited resonance, and cause the generation of a corresponding digital data line. Second, third, and fourth imaging sequence segments are also applied, sequentially, to excite resonance in second, third, and fourth sub-regions of the volume of interest, phase and frequency-encode the excited resonance, and cause the generation of corresponding digital data lines. The data lines from the first sub-region are reconstructed into a first sub-region image. The data lines from the second sub-region are reconstructed into a second sub-region image. The data lines from the third sub-region are reconstructed into a third sub-region image. The data lines from the fourth sub-region are reconstructed into a fourth sub-region image. The first, second, third, and fourth sub-region images are stacked to generate an image of the volume of interest.

One advantage of the present invention resides in its reduction in overall scan time.

Another advantage of the present invention resides in a reduction in artifacts, particularly imaging duration related artifacts.

Yet another advantage of the present invention is that it can perform volumetric high-resolution angiographic imaging in about the same time as prior art lower-resolution angiographic imaging.

Another advantage of the present invention is that it promotes the imaging of blood, particularly in small vessels.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 2 illustrates one repeat of a preferred imaging sequence; and,

FIG. 3 is a diagrammatic illustration of a plurality of slabs superimposed on a subject;

FIG. 4 is an alternate embodiment of the imaging sequence of FIG. 2.

DETAILED DESCRIPTION OF THE PREFERRED EMBODIMENT

Figure 1:
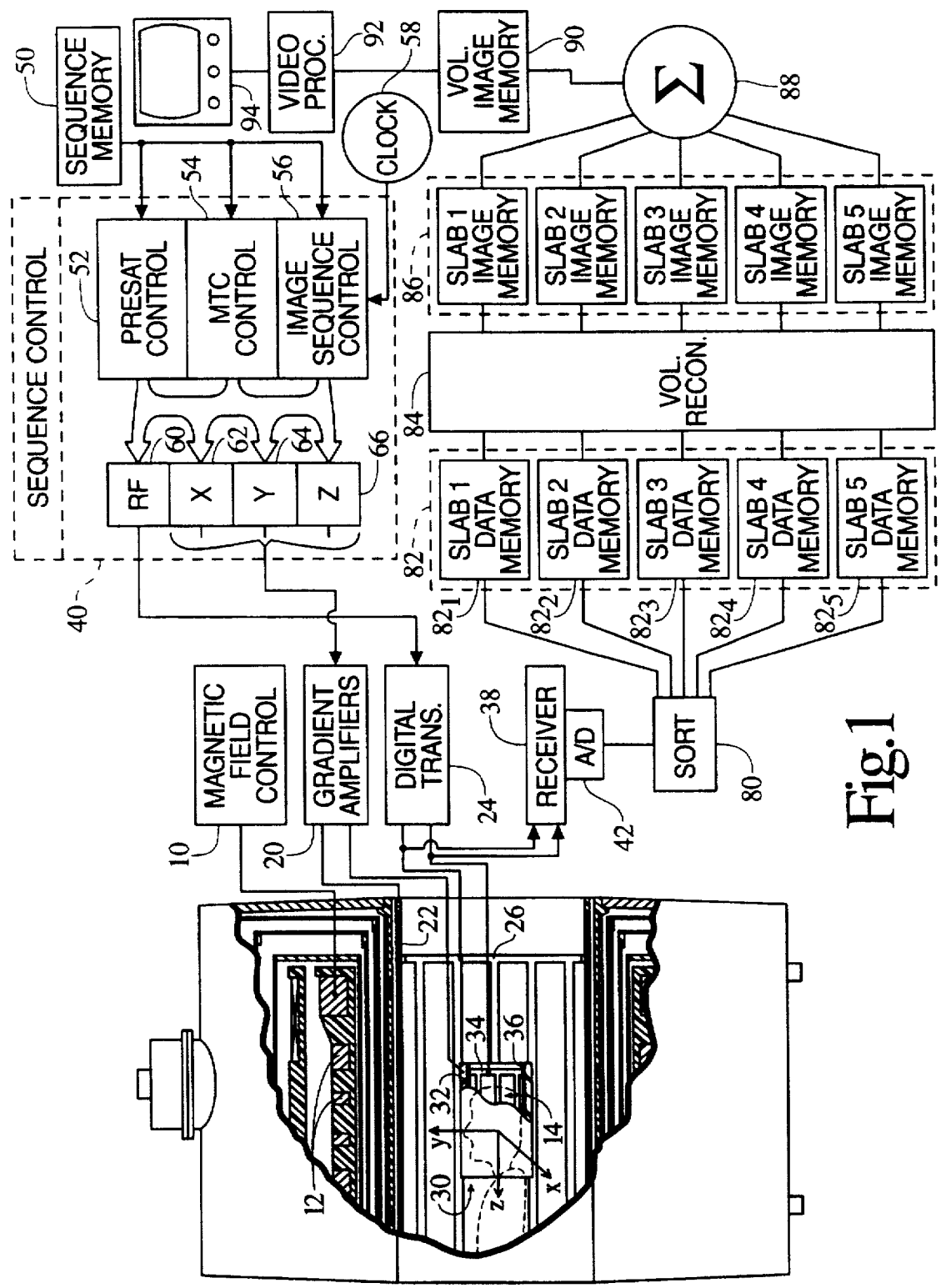
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses to a whole body RF coil 26 to transmit RF pulses into the examination region. Each typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38, preferably a digital receiver.

A sequence control circuit 40 controls the gradient pulse amplifiers 20 and the transmitter 24 to generate any of a plurality of sequences, preferably multiple-echo sequences, such as echo-planar imaging, echo-volume imaging, gradient and spin-echo imaging, fast spin-echo imaging, and the like. For the selected sequence, the receiver 38 receives a plurality of data lines in rapid succession following each RF excitation pulse. An analog-to-digital converter 42 converts each data line to a digital format. The analog-to-digital converter disposed between the radio frequency receiving coil and the receiver for digital receivers and downstream from an analog receiver.

With reference to FIG. 2 and continuing reference to FIG. 1, the sequence control circuit 40 is connected with a sequence memory 50 which stores a plurality of sequence segments including at least one prepreparation sequence segment, particularly presaturation sequences, magnetization transfer contrast (MTC) sequences, as well as motion corrected imaging sequences, and other imaging sequences. The imaging sequences are typically based on spin or field-echoes, as are known in the art. An operator, through a control console (not shown) selects one of the sequences. The sequence control circuit 40 includes a presaturation sequence control 52 for controlling the application of presaturation sequence segments, an MTC sequence control 54 for controlling the application of the MTC sequence segment corrections, and an imaging sequence control 56 for implementing the selected imaging sequence section. A clock, a stepping circuit, or a processor 58 is connected with the various sequence controls to cause them to be repeated and provide appropriate timing for any necessary adjustments from repetition to repetition, e.g., stepping a phase-encode gradient. The presaturation, MTC, and imaging sequence controllers are connected with a radio frequency circuit which enables the digital transmitter 24 to transmit appropriate RF pulses at appropriate times. X, y, and z-gradient drivers 62, 64, 66 control the gradient amplifiers to place appropriate gradients along x, y, and z-axes for slice selection, phase-encoding in two dimensions, and frequency-encoding along a read direction.

With particular reference to FIG. 3, the presaturation controller 52 causes saturation of a selected region of the subject, such as a plane 70. In angiography applications, the saturation plane is selected such that it saturates blood flow which reaches a volume of interest 72 through the veins. In this manner, arterial blood flow is emphasized in the resultant image. Presaturation can be used to saturate other regions for other purposes. For example, saturation planes or regions can be introduced on either side of the volume of interest. As another example, saturation planes may be positioned to saturate all blood coming into the volume of interest such that blood appears black rather than bright. Various other saturation techniques are contemplated, as are conventional in the art.

The MTC application saturates hydrogen dipoles in the region of interest at resonance frequencies which are outside of the spectrum of frequencies which are to be read from the region of interest during the read gradients. In head imaging, the MTC application can be used to suppress contributions from white and gray matter. Typically, the MTC correction adjusts the RF pulse such that a frequency spectrum adjacent one or both sides of the spectrum used in imaging is saturated.

With reference to FIGS. 1, 2, and 3, the sequence control 40 first causes the RF, slice select, phase-encode, and read gradients of the selected presaturation sequence to be applied, then the pulses of the MTC sequence, followed by a first imaging sequence portion to excite, encode, and read resonance from a first slab $74_1$. Next, the imaging sequence is adjusted and repeated to generate a view from a third slab $74_3$. Next, the imaging sequence is adjusted and repeated to generate a view from a fifth slab $74_5$. The sequence is again repeated to generate views or data lines from a second slab $74_2$ and again for a fourth slab $74_4$. Of course, data lines can be collected from more than five slabs or from less than five slabs. Preferably, the collection of views from slabs is staggered such that views from two adjacent slabs are not collected back-to-back in order to minimize cross-talk between the slabs. After data is collected from the last slab, the full sequence (including presaturation and MTC portions) is repeated immediately. Where appropriate, a delay may be interposed. For example, when imaging small vessels with slow blood flow, longer times between presaturation brightens blood in the image.

With reference again to FIG. 1, a sorting program or circuit 80 sorts the received data lines into data memories for each slab. In the embodiment of FIG. 1, five slab (slab 1, 2, 3, 4, and 5) data memories $82_1$, $82_2$, $82_3$, $82_4$, $82_5$ are provided for purposes of illustration. A volume reconstruction processor 84 reconstructs the data from each of the slab data memories into corresponding slab image representations or data which are stored in corresponding slab image memories 86. Again, five slab image memories $86_1$, $86_2$, $86_3$, $86_4$, and $86_5$ are provided for purposes of illustration. The slab image representations are combined, preferably stacked, by a slab image combining or stacking circuit 88 into a volume image representation for storage in a volume image memory 90. Under operator control, data for selected planes, oblique slices, surface renderings, projection, maximum intensity projection, and other display formats are retrieved from the volume image memory. A video processor 92 converts the retrieved data into appropriate form for display on a monitor 94, such as a CRT, active matrix, CCD, or other imaging device.

As another embodiment, the imaging sequences are selected which generate multiple views or data lines within each image sequence component. In this manner, two or more data lines per slab are generated in each repetition. Gradient-echo sequences, fast spin-echo sequences, and the like, as are known in the art, are utilized to generate multiple views per excitation.

With reference to FIG. 4, it is further to be appreciated that a view need not be taken in every slice after each presaturation, MTC, or other prepreparation sequence segment. In the embodiment of FIG. 4, the prepreparation sequence segments are followed by imaging sequences which collected one or more views in each of the odd-numbered slabs. After the next prepreparation sequence segment, imaging sequence segments are applied to generate one or more views in each of the even-numbered slabs. Of course, views can be generated in other fractions of the total numbers of slabs and with other orderings among the slabs.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system which includes a magnet for generating a temporally constant magnetic field through an examination region, a transmitter for inducing dipoles in the examination region to resonance such that radio frequency resonance signals are generated, gradient amplifiers and gradient magnetic field coils for generating at least slab select, phase, and read magnetic field gradient pulses along orthogonal axes across the examination region, a receiver for receiving and demodulating the radio frequency magnetic resonance signals read during the read gradients to produce a series of views, and an image memory for storing a reconstructed volume image representation, the system further comprising:

a sequence controller for controlling the transmitter and the gradient amplifiers to cause in each repetition the application of at least one prepreparation sequence segment which excites selected dipoles, the prepreparation sequence segment achieves one of:

saturation of dipoles of flowing substances flowing in a saturation region upstream from the examination region such that the flowing substances that flow into the examination region through the saturation region are at least partially saturated; and selectively excites a limited frequency spectrum within the entire examination region to precondition dipoles of only selected substances;

a first imaging sequence segment for inducing magnetic resonance in a first slab of the examination region, phase and frequency-encoding the induced resonance, and receiving at least one view from the first slab and a second imaging sequence segment for inducing magnetic resonance in a second slab of the examination region, phase and frequency-encoding the induced resonance, and receiving at least one view from the second slab;

a sorter connected with the receiver for sorting the views by slab among at least a first slab data memory and a second slab data memory;

a volume reconstruction processor for reconstructing the data from the first slab data memory into a first slab image representation and the data from the second slab data memory into a second slab image representation;

a circuit for combining the first and second slab image representations to form the volume image representation stored in the image memory.

2. The magnetic resonance imaging system as set forth in claim 1 further comprising:

a video processor for retrieving selected data from the volume image representation from the volume image memory and converting the data into appropriate format for display on a video display unit.

3. A method of magnetic resonance imaging in which a plurality of imaging sequence repetitions are applied to generate a plurality of data lines, the method comprising:

in each of the plurality of imaging sequence repetitions:

applying at least one prepreparation sequence segment in a region adjacent and outside of an imaging volume defined by a plurality of slabs including a first slab and a second slab;

applying a first imaging sequence segment which excites magnetic resonance in the first slab, phase and frequency-encodes the excited resonance, and causes the generation of a corresponding digital data line;

applying a second imaging sequence segment which excites magnetic resonance in the second slab, phase and frequency-encodes the excited resonance and causes the generation of a corresponding digital data line;

reconstructing the digital data lines from the first slab into a first electronic slab image representation;

reconstructing the digital data lines from the second slab into a second electronic slab image representation;

combining the first and second slab image representations.

4. The method as set forth in claim 3 wherein:

a flowing material passes through the region in which the prepreparation sequence segment is applied to the imaging volume;

the prepreparation sequence segment saturates dipoles of the flowing material, such that the flowing material dipoles in the imaging volume are at least partially saturated when the first and second imaging sequence segments are applied.

5. The method as set forth in claim 3 further including:

in each of a further plurality of imaging sequence repetitions:

reapplying the at least one prepreparation sequence segment to the region adjacent and outside of the imaging volume, the imaging volume further being defined by a third slab and a fourth slab;

applying a third imaging sequence segment which excites magnetic resonance in the third slab, phase and frequency-encodes the excited resonance, and causes the generation of a corresponding digital data line;

applying a fourth imaging sequence segment which excites magnetic resonance in the fourth slab, phase and frequency-encodes the excited resonance, and causes the generation of a corresponding digital data line;

reconstructing the data lines from the third slab into a third electronic slab image representation;

reconstructing the data lines from the fourth slab into a fourth electronic slab image representation;

combining the first, second, third, and fourth electronic slab image representations.

6. The method as set forth in claim 5 wherein the third slab is disposed between the first and second slabs and the second slab is disposed between the third and fourth slabs such that the slabs are interleaved.

7. The method as set forth in claim 3 wherein the imaging volume is further defined by a third slab and a fourth slab, the method further including:

in each of the plurality of imaging sequence repetitions:

applying a third imaging sequence segment which excites magnetic resonance in the third slab, phase and frequency-encodes the excited resonance, and causes the generation of a corresponding digital data line;

applying a fourth imaging sequence segment which excites magnetic resonance in the fourth slab, phase and frequency-encodes the excited resonance, and causes the generation of a corresponding digital data line;

reconstructing the data lines from the third slab into a third electronic slab image representation;

reconstructing the data lines from the fourth slab into a fourth electronic slab image representation;

combining the first, second, third, and fourth slab image representations.

8. The method as set forth in claim 7 wherein the third slab is disposed between the first and second slabs and the second slab is disposed between the third and fourth slabs such that the slabs are interleaved.

9. The method as set forth in claim 3 wherein the first imaging sequence segment generates a plurality of data lines in each repetition; and the second imaging sequence segment generates a plurality of data lines in each repetition.

10. A method of magnetic resonance imaging in which a plurality of imaging sequence repetitions are applied to generate a plurality of data lines, the method comprising:

in each of the plurality of imaging sequence repetitions:

applying at least one of:

a presaturation sequence segment; and a magnetization transfer contrast application sequence segment;

applying a first imaging sequence segment which excites magnetic resonance in a first slab, phase and frequency-encodes the excited resonance, and causes the generation of a corresponding digital data line;

applying a second imaging sequence segment which excites magnetic resonance in a second slab, phase and frequency-encodes the excited resonance and causes the generation of a corresponding digital data line;

reconstructing the digital data lines from the first slab into a first electronic slab image representation;

reconstructing the digital data lines from the second slab into a second electronic slab image representation;

combining the first and second slab image representations.

11. A method of magnetic resonance imaging a volume of interest by applying a plurality of magnetic resonance imaging sequence repetitions, the volume of interest being defined by a plurality of sub-regions including a first sub-region, a second sub-region, a third sub-region, and a fourth sub-region, the method comprising:

in each of a plurality of the magnetic resonance imaging repetitions:

applying the at least one preparation sequence segment to the entire volume of interest such that the first, second, third, and fourth sub-regions are all subject to the same prepreparation;

applying a first imaging sequence segment which excites magnetic resonance in the first sub-region of the volume of interest, phase and frequency-encodes the excited resonance, and causes the generation of a corresponding digital data line;

applying a second imaging sequence segment which excites magnetic resonance in the second sub-region of the volume of interest, phase and frequency-encodes the excited resonance, and causes the generation of a corresponding digital data line;

applying a third imaging sequence segment which excites magnetic resonance in the third sub-region of the volume of interest, phase and frequency-encodes the excited resonance, and causes the generation of a corresponding digital data line;

applying a fourth imaging sequence segment which excites magnetic resonance in the fourth sub-region of the volume of interest, phase and frequency-encodes the excited resonance, and causes the generation of a corresponding digital data line;

reconstructing a plurality of data lines from the first sub-region into a first sub-region image;

reconstructing a plurality of data lines from the second sub-region into a second sub-region image;

reconstructing a plurality of data lines from the third sub-region into a third sub-region image;

reconstructing a plurality of data lines from the fourth sub-region into a fourth sub-region image;

stacking the first, second, third, and fourth sub-region images to generate an image of the volume of interest.

12. The method as set forth in claim 11 wherein the preparation sequence includes a magnetization transfer contrast application sequence segment.

13. The method as set forth in claim 11 wherein the volume of interest is further defined by a fifth sub-region, a sixth sub-region, and a seventh sub-region, the method further including:

in each of another plurality of repetitions of an imaging sequence:

reapplying the prepreparation sequence to the entire volume of interest such that the first, second, third, fourth, fifth, sixth, and seventh sub-regions are all subjected again to the same prepreparation;

applying a fifth imaging sequence segment which excites magnetic resonance in the fifth sub-region of the volume of interest, phase and frequency-encodes the excited resonance, and causes the generation of a corresponding digital data line, the fifth sub-region being between the first and second sub-regions;

applying a sixth imaging sequence segment which excites magnetic resonance in the sixth sub-region of the volume of interest, phase and frequency-encodes the excited resonance, and causes the generation of a corresponding digital data line, the sixth sub-region being between the second and third sub-regions;

applying a seventh imaging sequence segment which excites magnetic resonance in the seventh sub-region of the volume of interest, phase and frequency-encodes the excited resonance, and causes the generation of a corresponding digital data line, the seventh sub-region being between the third and fourth sub-regions;

reconstructing a plurality of data lines from the fifth sub-region into a fifth sub-region image;

reconstructing a plurality of data lines from the sixth sub-region into a sixth sub-region image;

reconstructing a plurality of data lines from the seventh sub-region into a seventh sub-region image;

combining the first, second, third, fourth, fifth, sixth, and seventh sub-region images.

14. The method as set forth in claim 13 wherein the sub-regions are parallel contiguous slabs each a plurality of slices thick.

15. A method of magnetic resonance imaging a volume of interest by applying a plurality of magnetic resonance imaging sequence repetitions, the method comprising:

in each of a plurality of the magnetic resonance imaging repetitions:

at a start of each repetition, saturating material flowing into the volume of interests applying a first imaging sequence segment which excites magnetic resonance in a first sub-region of the volume of interest, phase and frequency-encodes the excited resonance, and causes the generation of a corresponding digital data line;

applying a second imaging sequence segment which excites magnetic resonance in a second sub-region of the volume of interest, Phase and frequency-encodes the excited resonance, and causes the generation of a corresponding digital data line;

applying a third imaging sequence segment which excites magnetic resonance in a third sub-region of the volume of interest, phase and frequency-encodes the excited resonance, and causes the generation of a corresponding digital data line;

applying a fourth imaging sequence segment which excites magnetic resonance in a fourth sub-region of the volume of interest, phase and frequency-encodes the excited resonance, and causes the generation of a corresponding digital data line;

reconstructing a plurality of data lines from the first sub-region into a first sub-region image;

reconstructing a plurality of data lines from the second sub-region into a second sub-region image;

reconstructing a plurality of data lines from the third sub-region into a third sub-region image;

reconstructing a plurality of data lines from the fourth sub-region into a fourth sub-region image;

stacking the first, second, third, and fourth sub-region images to generate an image of the volume of interest.

16. A method of magnetic resonance imaging a volume of interest by applying a plurality of magnetic resonance imaging sequence repetitions, the method comprising:
  in each of a Plurality of the magnetic resonance imaging repetitions:
    in each repetition, saturating macromolecules which are not of interest at least within the volume of interest to suppress background in the image of the volume of interest;
    applying a first imaging sequence segment which excites magnetic resonance in a first sub-region of the volume of interest, phase and frequency-encodes the excited resonance, and causes the generation of a corresponding digital data line;
    applying a second imaging sequence segment which excites magnetic resonance in a second sub-region of the volume of interest, chase and frequency-encodes the excited resonance, and causes the generation of a corresponding digital data line;
    applying a third imaging sequence segment which excites magnetic resonance in a third sub-region of the volume of interest, phase and frequency-encodes the excited resonance, and causes the generation of a corresponding digital data line;
    applying a fourth imaging sequence segment which excites magnetic resonance in a fourth sub-region of the volume of interest, phase and frequency-encodes the excited resonance, and causes the generation of a corresponding digital data line;
  reconstructing a plurality of data lines from the first sub-region into a first sub-region image;
  reconstructing a plurality of data lines from the second sub-region into a second sub-region image;
  reconstructing a plurality of data lines from the third sub-region into a third sub-region image;
  reconstructing a plurality of data lines from the fourth sub-region into a fourth sub-region image;
  stacking the first, second, third, and fourth sub-region images to generate an image of the volume of interest.

* * * * *